United States Patent [19]

Tuttle

[11] Patent Number: 4,484,136
[45] Date of Patent: Nov. 20, 1984

[54] TEST SET FOR TRANSIENT PROTECTION DEVICES

[75] Inventor: John E. B. Tuttle, Falls Church, Va.

[73] Assignee: The United States of America as represented by the Secretary of the Army, Washington, D.C.

[21] Appl. No.: 277,306

[22] Filed: Jun. 25, 1981

[51] Int. Cl.³ .............................................. G01R 31/02
[52] U.S. Cl. .............................. 324/158 R; 324/158 D
[58] Field of Search ............... 324/158 R, 158 D, 102, 324/424; 340/635, 638, 649

[56] References Cited

U.S. PATENT DOCUMENTS

2,968,001  1/1961  Archer ........................... 324/158 D
3,458,814  7/1969  Ryan ............................. 324/158 D

Primary Examiner—Ernest F. Karlsen
Attorney, Agent, or Firm—Anthony T. Lane; Robert P. Gibson; Saul Elbaum

[57] ABSTRACT

A method and device for testing transient protection circuits comprising positive and negative high voltage protection circuits and high voltage fast rise time protection circuits. A bipolar test signal with alternate positive and negative high voltage pulses is applied to the circuit under test. Determination is made whether the pulses are within a predetermined voltage window. Signals indicating pass/fail responsive to that determination are generated. A high voltage fast rise time negative pulse is applied to the circuit under test. Changes in the voltage-time waveform are sensed and compared to predetermined levels. Pass/fail signals are generated in response to the comparison.

12 Claims, 6 Drawing Figures

Fig. 4 — SPARKGAP BREAKDOWN DETECTOR fig. 5

BIPOLAR PULSE AMPLIFIER fig. 6

TEST SET FOR TRANSIENT PROTECTION DEVICES

RIGHTS OF THE GOVERNMENT

The invention described herein may be manufactured, used or licensed by or for the Government of the United States of America for governmental purposes without payment to me of any royalties thereof.

BACKGROUND OF THE INVENTION

The present invention relates generally to a test set for transient protection devices designed to test these devices in their operational environment. The test set of the present invention tests not only surge arresting circuits but also tests for wiring continuity in the circuit to be tested.

There exists numerous radio and telephonic communications facilities having transient protection devices. To ensure that the transient protection devices are functional without affecting the circuits they are supposed to protect, there exists a need for a compact, inexpensive, rapid and simple go/no go tester. Many of the transient protection devices, even for relatively small communications facilities have as many as 48 individual transient protection circuits that would need to be individually tested. This constitutes a single common entry panel which terminates wires from distant communications facilities. A signal entry panel can accommodate up to 24 four wire channels and there can be more than one signal entry panel per each of the communications facility. The transient protection devices when installed are inserted between binding posts and the circuits to be protected.

Each of the individual transient protection circuits is comprised of a low pressure, gas filled spark gap on the input side and a bipolar zener device on the output side with low value of inductance (100 microhenry) in between. For example, the bipolar Zener device may be such devices as manufactured by General Semiconductor Corp., Tempe, AZ, under the tradename "Transzorb." Transient protection is achieved from a single wire to ground, usually the frame of the signal entry panel. The spark gap operates by providing a momentary short circuit to ground whenever its breakdown voltage is exceeded. For a transient with a slow rise time, the breakdown of the spark gap is typically 850 volts. For transients with a fast rise time, the breakdown voltage is considerably higher. The bipolar zener devices operate by clipping the positive and negative excursions of the offending transients. In this case, the clipping voltage is 140 volts ±20% for both polarities. Thus, for transient protection circuits with spark gaps and bipolar zener devices it is necessary to conduct two tests per circuit.

One problem that exists when testing amplitude limiting devices, such as bipolar zener devices, is that it is necessary to subject them to voltages in excess of their rated breakdown voltages. Typically this is 150 volts. A DC source with sufficient voltage could be provided to apply voltage to the transorb and measure the voltage at which amplitude limiting occurred. There are two major disadvantages to this: (1) the amplitude limiting device is a bipolar device so the operator conducting the test would have to reverse the polarity, thus increasing the time required to conduct the testings; and (2) there would be a steady high voltage DC potential on the test lead which is a potential safety hazard. Another method would be to use a 60 HZ power line AC signal to obtain high voltage breakdown for both polarities. Again, this would constitute a safety hazard. The present invention circumvents the safety hazard by providing an alternating positive and negative polarity bipolar pulse train. The test leads can be held, one in each hand and not feel an electric shock. Another advantage of the present invention is that less power is consumed even under load conditions and therefore reduces heating within the instrument case. Another advantage of the present invention is that the utilization of a bipolar pulse train in combination with the technique for testing spark gap breakdown is also used to determine if spark gaps within a transient protection device assembly are good. The bipolar pulse train is processed to determine whether there are any short circuits to ground. Without the bipolar pulse train, short circuits to ground would deceive the spark gap breakdown detector into indicating that a spark gap had broken down correctly.

The present invention provides a new and novel technique for testing spark gaps. As indicated above, during the testing of the bipolar zener devices, one half of the spark gap test will have been performed and short circuits to ground will have been ruled out. The conventional technique used for in-circuit testing of spark gaps requires a high voltage pulse generator, a fast sweep oscilloscope and a polaroid camera. A high voltage pulse, usually single shot, is applied between input and ground. The voltage-time waveform at the output is recorded on polaroid film. The disadvantage to this technique, besides the necessity for the above listed equipment, is that a very experienced technician is needed to perform the test and to interpret the visual display. Another major disadvantage is that it is necessary to have physical access to the circuit output. The present invention circumvents these disadvantages in that the operator need not be experienced nor is it necessary to interpret visual displays (other than recognizing a color of an indicator LED). Additionally, the circuit need not be removed nor is it necessary to have access to the output of the circuit under test.

It is therefore one object of this invention to provide a method for testing transient protection circuits that is simple, rapid and safe.

It is another object of this invention to provide a method for testing transient protection circuits that does not require physical access to the circuits under test.

It is a further object of this invention to provide a device for testing transient protection circuits that is compact, inexpensive and safe.

It is still another object of this invention to provide a device for testing transient protection circuits that does not require high voltage-high power power supplies and does not require physical access to the circuits under test.

It is still a further object of this invention to provide a device for testing transient protection circuits that does not require an experienced operator.

Other objects, advantages and novel features of the present invention will become apparent from the following detailed description of the invention when considered in conjunction with the accompanying drawings.

SUMMARY OF THE INVENTION

These and other objects, features, and advantages of the invention are accomplished by a new type of device for testing transient protection circuits comprising positive and negative high voltage protection circuits and high voltage fast rise time protection circuits. In the test mode for testing the positive and negative high voltage protection circuits, a bipolar test signal with alternate positive and negative high voltage pulses is generated and applied to the circuit under test and determination is made of whether the bipolar test signal is within allowable positive and negative voltage windows. A pass or fail signal is generated in response to that determination.

In the test mode for testing high voltage fast rise time circuits a high voltage negative test pulse is generated with a rapid rise time and rapid decay time and applied to the circuit under test. Changes in the voltage time waveform are sensed and compared to predetermined voltage-time levels. A pass or fail signal is generated in response to that comparison.

BRIEF DESCRIPTION OF THE DRAWINGS

The above and further objects and novel features of the invention will more fully appear from the following description when the same is read in connection with the accompanying drawings. It is to be understood, however, that the drawings are for the purpose of demonstration only, and are not intended as a definition of the limits of the invention.

DESCRIPTION OF THE PREFERRED EMBODIMENT

Figure 1:
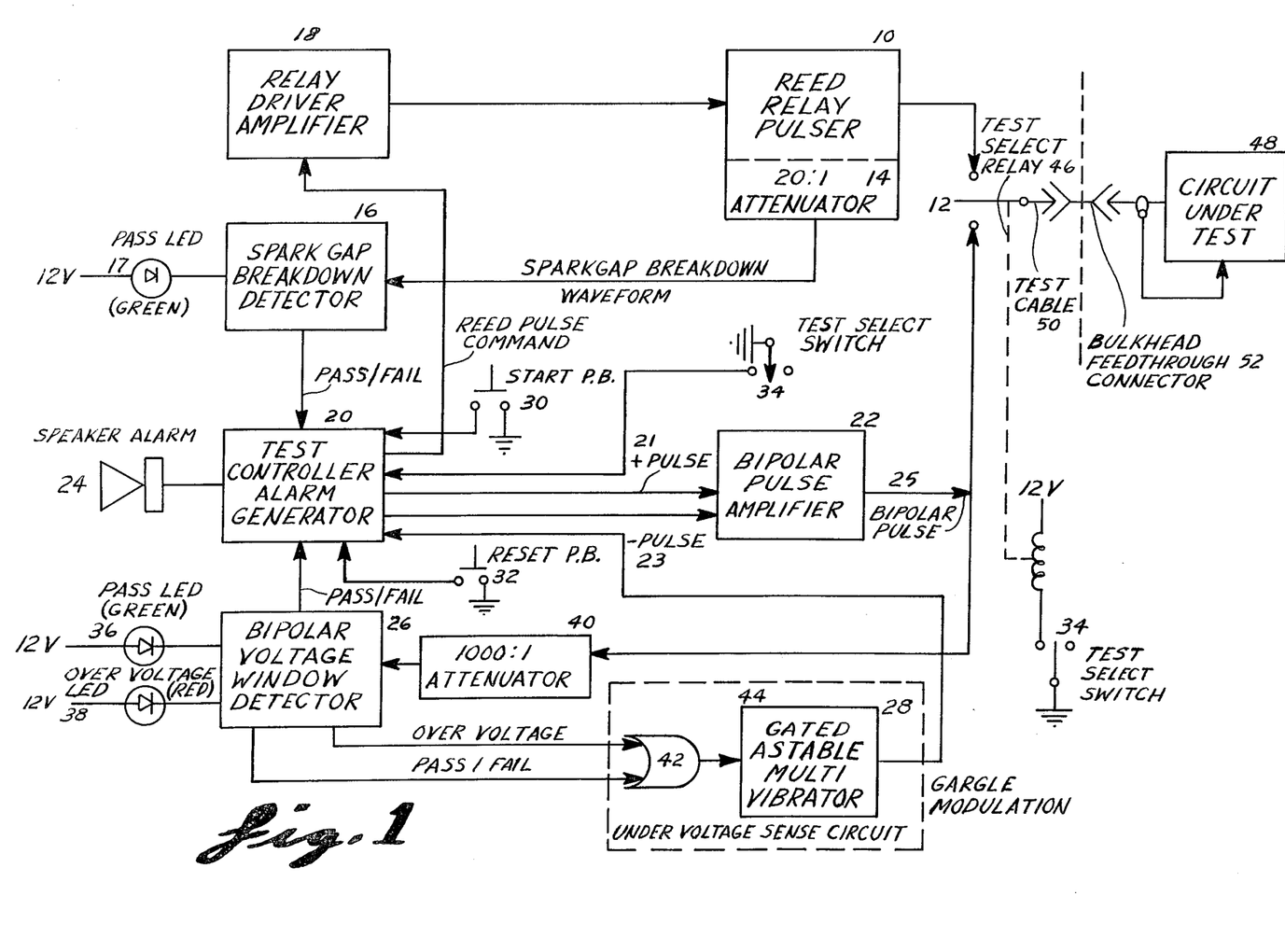
FIG. 1 is a schematic of an embodiment of the present invention.

The present invention will now be described in conjunction with the accompanying drawings. Referring to FIG. 1, which is a schematic of an embodiment of the present invention, the device comprises a reed relay pulser 10 connected to one pole of switch 12 and 20:1 attenuator 14 which is in turn connected to spark gap breakdown detector 16 which controls pass LED 17. Relay driver amplifier 18 provides an input to reed relay pulser 10. Test controller alarm generator 20 provides an input to relay driver amplifier 18, a plus pulse and a minus pulse to bipolar pulse amplifier 22, drives speaker alarm 24, receives pass/fail signals from spark gap breakdown detector 16 and bipolar voltage window detector 26, receives a signal from under voltage sense circuit 28, and is connected to start pushbutton switch 30, reset pushbutton switch 32 and test select switch 34. Bipolar voltage window detector 26 controls pass LED 36 and overvoltage LED 38, receives an input from 1000:1 attenuator 40 and provides an overvoltage and pass/fail signal to undervoltage sense circuit 28. Bipolar pulse amplifier 22 is connected to test select switch 34 and provides an output to one pole of switch 12 and to 1000:1 attenuator 40. Undervoltage sense circuit 28 comprises an AND gate 42 and gated astable multi-vibrator 44. The position of switch 12 is controlled by test select relay represented at 46 which is in turn controlled by test select switch 34. The system is connected to the circuit under test represented at 48 by a coaxial cable 50 and bulkhead feedthrough connector 52.

When the system is operating in the zener device test mode, the test select switch 34 to test controller alarm generator 20 is grounded and test select relay 46 is energized. The output of the bipolar pulse amplifier 22 is coupled through the contacts of test relay 46 to the circuit under test 48. The signal at the input to the circuit under test 48 is attenuated by a factor of 1000 by 1000:1 attenuator 40 and fed to the input of voltage window detector 26. If the circuit under test limits the pulse train amplitude (to be described later) to within allowable limits, bipolar voltage window detector 26 will sense a "pass" condition, the green LED 36 will illuminate and the pass/fail output of the bipolar voltage window detector 26 will go low (zero volts). If there is an open circuit between the output of the test set and the circuit under test, or if the device clips the pulse train at an unacceptable high level, the bipolar voltage window detector 26 will sense an overvoltage fault condition, the red overvoltage LED 38 will illuminate, and the pass/fail output will go high (+12 volts). If an undervoltage condition is sensed, no LED will illuminate, the pass/fail output will go high, and undervoltage sense circuit 28 will output a gargle modulation which is input to test controller alarm generator 20. The audible alarm 24 is enabled when the operator pushes the start pushbutton 30 and if a fault condition is sensed the audible alarm will sound. To silence the audible alarm, the operator pushes the reset pushbutton 32. It is noted that when the test select switch 34 is in the zener device position, the reed relay pulser 10 is inhibited.

Figure 6:
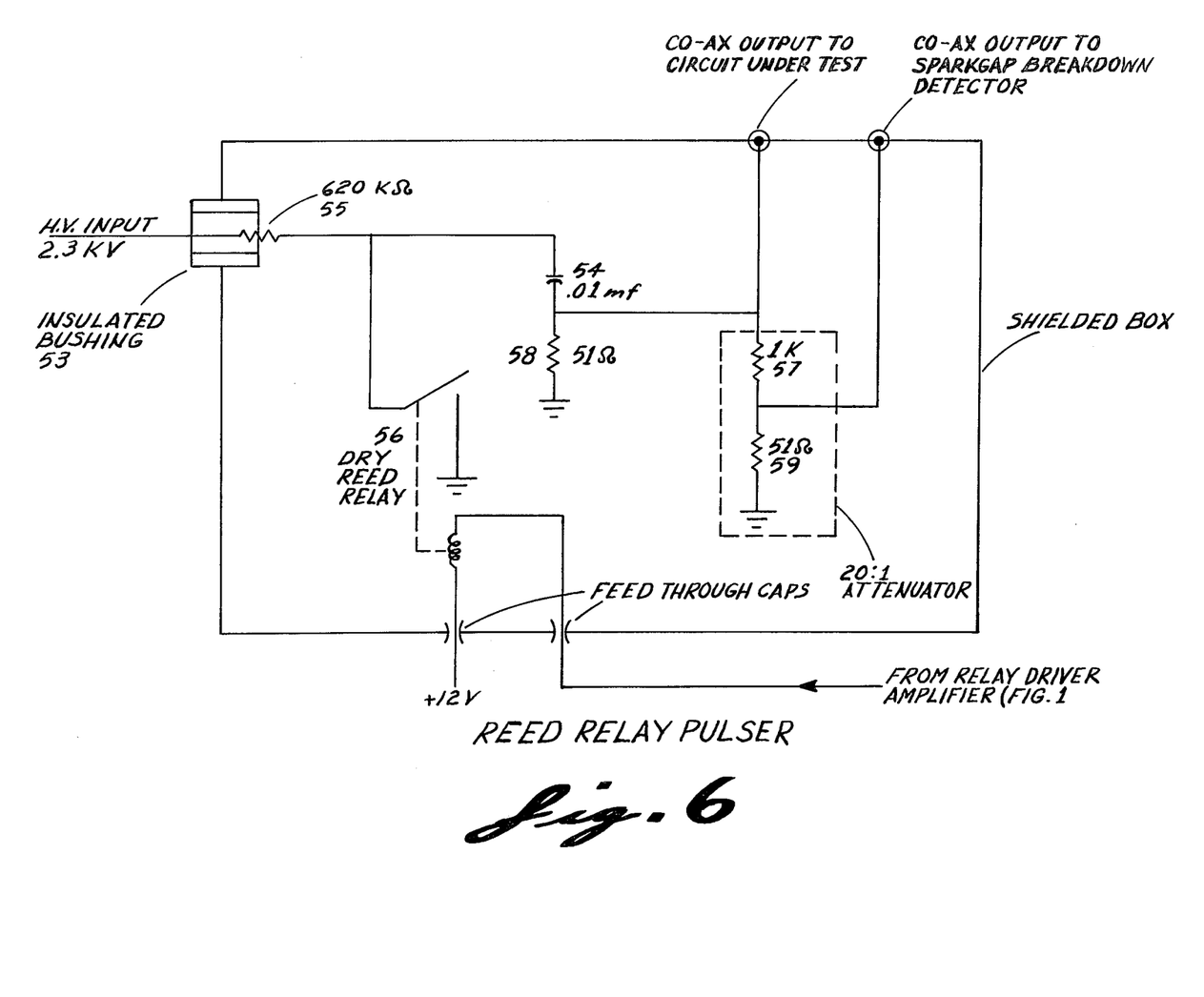
FIG. 6 is a schematic of the reed relay pulser subassembly of the embodiment shown in FIG. 1.

When the system is operating in the spark gap mode, the test select input to the test controller alarm generator 20 is high (+12 volts), the bipolar pulse amplifier 22 is inactive and test select relay 46 is inactivated. This connects the output of reed pulser 10 to the circuit under test. When the start pushbutton switch 30 is pushed, test controller alarm generator sends a 25 ms pulse to relay driver amplifier 18 which causes reed relay pulser 10 to activate. Referring to FIG. 6, storage capacitor 54 charged to +2.3 KV discharges to ground through the contacts of dry reed relay 56 and resistor 58. A fast rise negative going pulse is generated and excites the circuit under test. The resulting voltage-time waveform across the circuit under test is attenuated by 20:1 attenuator 14 and appears at the input to spark gap breakdown detector 16. If the spark gap breaks down properly, green LED 17 illuminates, the pass/fail output from spark gap breakdown detector 16 goes low and there is no audible alarm generated by test controller alarm generator 20.

The test controller alarm generator 20 provides the timing signals required for the generation of a zener device test signal and a spark gap breakdown pulse. In the zener device test mode, the test controller alarm generator 20 outputs two trains of alternately generated pulses; these drive the high voltage bipolar pulse amplifier 22 (described later in conjunction with FIG. 5). The two pulse trains, designated "plus pulse" and "minus pulse", 21, 23, FIG. 1 and FIG. 5, drive the positive and negative pulse channels of bipolar pulse amplifier 22. In the spark gap test mode, the controller generates a single shot 25 ms pulse called the reed pulse command which is input to relay driver amplifier 18, which in turn drives reed relay pulser 10. The test controller alarm generator 20 accepts the pass/fail outputs of the bipolar voltage window detector 26 and the spark gap breakdown detector 16 and, if a fault condition exists for the selected test, allows an alarm signal to be gated out.

Figure 2:
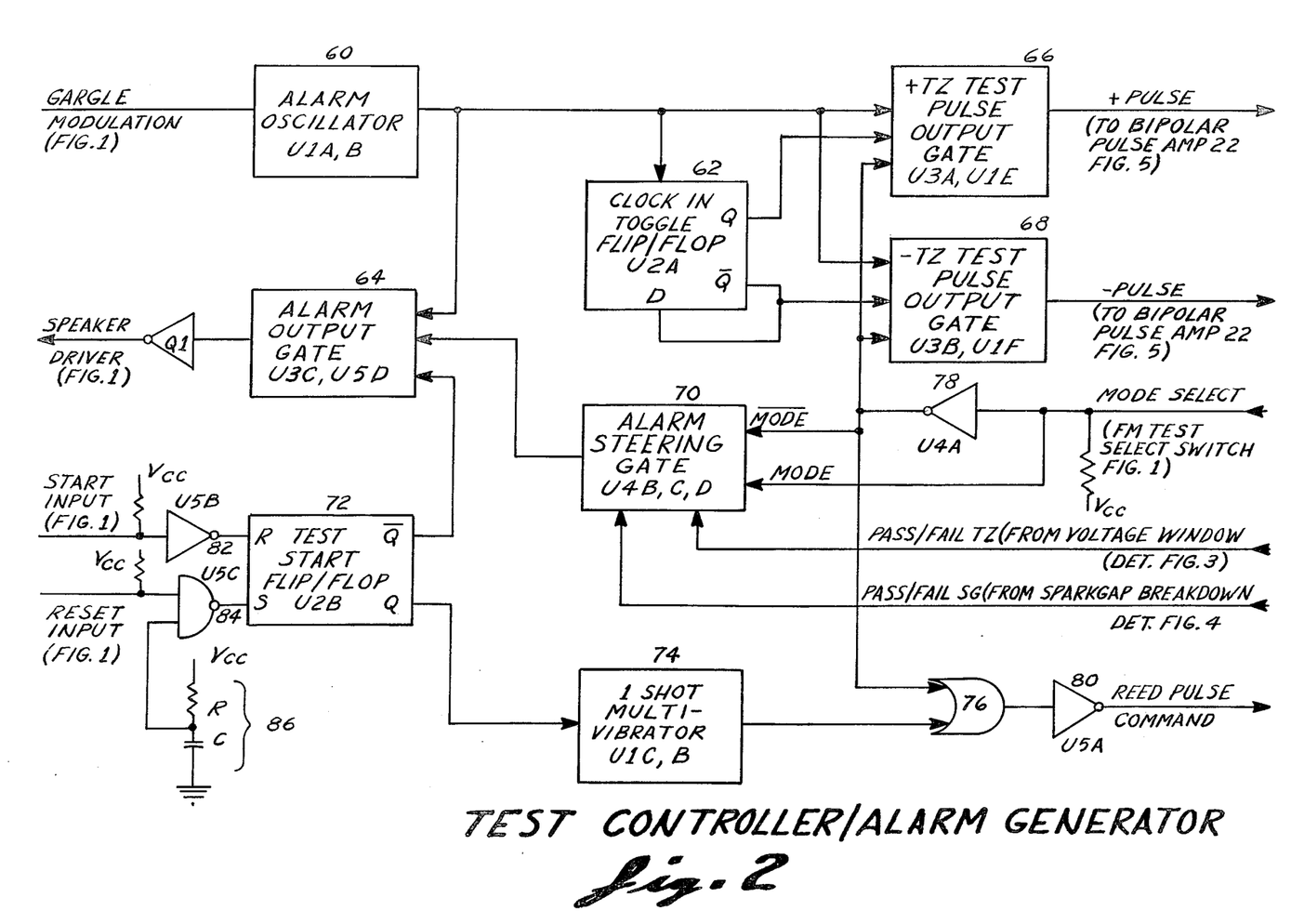
FIG. 2 is a schematic of the test controller/alarm generator subassembly of the embodiment shown is FIG. 1.
Figure 5:
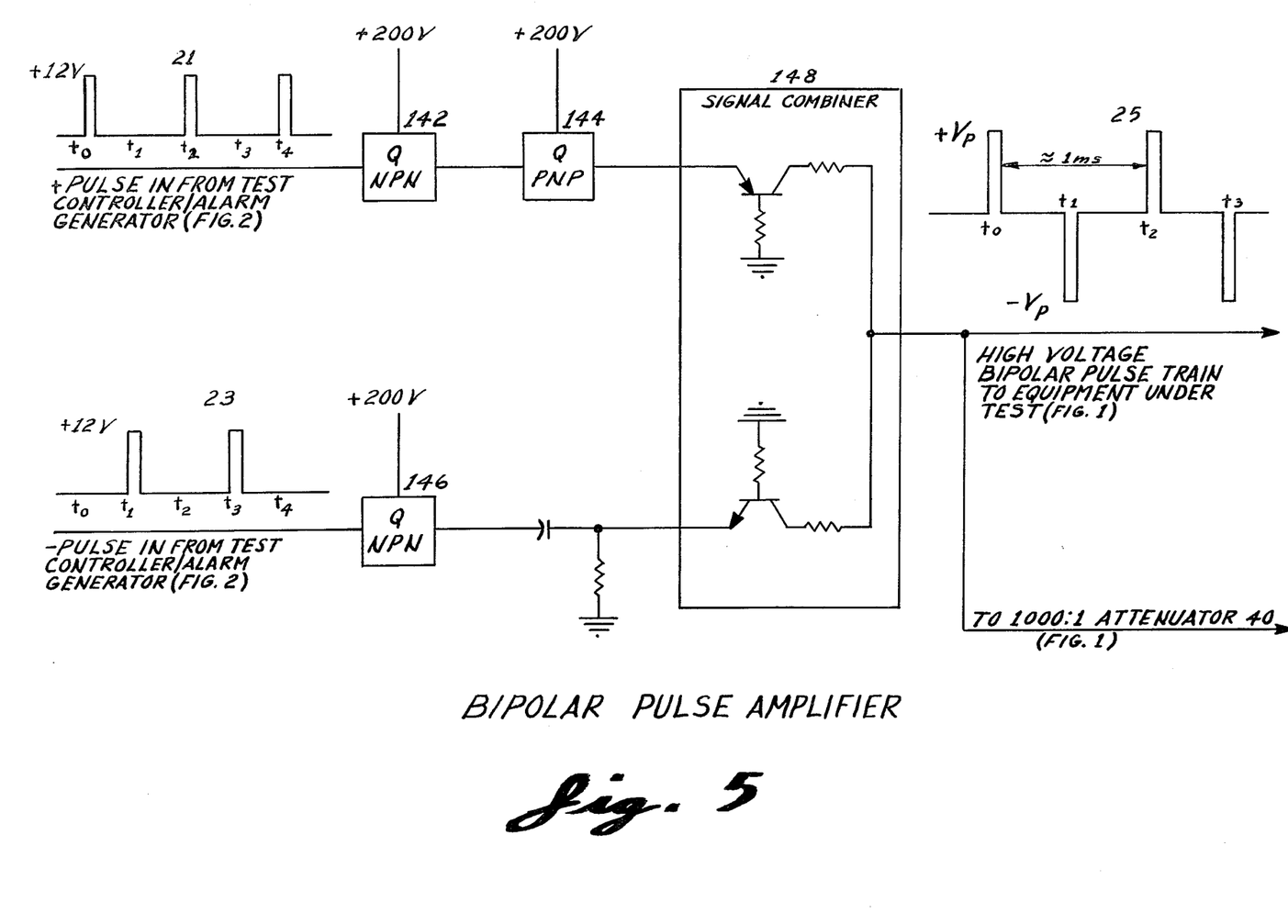
FIG. 5 is a schematic of the bipolar pulse amplifier subassembly of the embodiment shown in FIG. 1.

FIG. 2 is a block diagram of an embodiment of the test controller alarm generator 20. Alarm oscillator 60 receives an input from undervoltage sense circuit (gargle modulation) 44 and outputs to toggle flip/flop 62, alarm output gate 64, plus zener device (TZ) test pulse output gate U3A and AC coupled inverter U1E, indicated at 66, and minus TZ test pulse gate U3B and AC coupled inverter U1F, indicated at 68. Alarm output gate 64 drives speaker driver 24 (FIG. 1) and receives inputs from alarm oscillator 60, alarm steering gate 70 and test start flip/flop 72. Test start flip/flop 72 receives inputs from start input (FIG. 1) and reset input (FIG. 1) and outputs to alarm output gate 64 and one shot multivibrator 74 which outputs to OR gate 76 which in combination with an input from inverter 78 causes OR gate 76 to gate a reed pulse command via inverter 80 to relay driver amplifier 18 (FIG. 1). Alarm steering gate 70 outputs to alarm output gate 64 and receives inputs from test select switch 34 (FIG. 1) directly and via inverter 78 and receives zener device and spark gap pass/fail signals from voltage window detector 26 (FIG. 1). Toggle flip/flop 62 receives a clock input from alarm oscillator 60 and outputs to plus and minus test output gates 66, 68 which in turn gate plus and minus pulses respectively to bipolar pulse amplifier 22 (FIGS. 1, 5). The alarm oscillator 60 is a continuously oscillating astable multivibrator. In the absence of the gargle modulation, the frequency is 1 kHz. As shown in FIG. 2, the alarm oscillator 60 output is input to the clock input of toggle flip/flop 62, to one input each of the plus and minus TZ test pulse output gates, 66, 68 and to one input of alarm output gate 64. The toggle flip/flop 62 is one half of a dual type D flip/flop with the Q output tied to the D input. In this configuration, the flip/flop will change state whenever the alarm oscillator square wave undergoes a low to high transition. The zener device test pulse gates 66, 68 are three input NAND gates which combine the square wave from alarm oscillator 60 with the Q and $\bar{Q}$ outputs of toggle flip/flop 62. When the zener device test has been selected, these gates are alternately enabled. As these gates become enabled, their outputs go from high to low and remain in this state for one half the period of the square wave from alarm oscillator 60. The leading edge of this signal is AC coupled to the input of the inverter (U1E, U1F, respectively indicated at 66, 68) which follows. The resulting inverter outputs are called the plus and minus pulses which go from 0 to +12 volts and have a maximum width of 5 microseconds. The alarm output gate 64 is comprised of the three input AND gate U3C followed by inverter U5O. The AND gate U3C combines the output of the alarm oscillator 60, the output of alarm steering gate 70 and the OVE/Q/ output of the test start flip/flop 72. When the inputs from alarm steering gate 70 and test start flip/flop 72 are true, the alarm square wave is gated out. The test start flip/flop 72 is one half of a dual type D flip/flop used as an R/S flip/flop. When the test start push button 30 (FIG. 1) is pushed,
the $\bar{Q}$ goes low (0 volts). The alarm steering gate 70 functions as a single pole double throw switch. It selects one of the two pass/fail inputs depending upon which test is selected. The one shot multivibrator 74 is comprised of inverters UIB and C and associated passive components. This circuit triggers on the high to low transition of the Q output of test start flip/flop 72. When one shot multivibrator is triggered, the output goes from high to low and remains in this state for about 25 milliseconds. The high to low transition which triggers this circuit is initiated when the test start pushbutton 30 (FIG. 1) is pushed. The test start flip/flop 72 must be returned to the "set" condition before the multivibrator can be retriggered. This is done by pushing the reset pushbutton 32 (FIG. 1). The OR gate 76 is comprised of diodes D2 and D3 and prevents the multivibrator output from activating the high voltage reed relay while the test set is in the zener device mode. The mode select input of the test controller alarm generator is tied to the input of inverter 78 and to one input of alarm steering gate 70. The output of inverter 78 is input to alarm steering gate 70, the zener device pulse output gates 66, 68 and to the anode of D3 in OR gate 76. In the tranzorb mode, the mode select input is at ground potential and the output of inverter 78 is in the high state. The zener device test pulse gates 66, 68 are enabled, the alarm steering gate 70 selects the TZ pass/fail input and the input to inverter 80 is held in the high state. In the spark gap test mode, the output of inverter 78 is low, the zener device test pulse gates 66, 68 are inhibited, the alarm steering gate 70 selects the spark gap pass/fail input and the inhibit is removed from D3 of OR gate 76. When test start push button 30 (FIG. 1) is pushed, the multivibrator is triggered and its output is coupled through D2 of OR gate 76. Thus pulse is inverted by inverter 80 and appears at the output of the test controller alarm generator 20 (FIG. 1) i.e., the reed pulse command that is input to relay driver amplifier 18 (FIG. 1). The start and reset inputs to test start flip/flop 72 come the start test push button 30, (FIG. 1) and reset push button 32 (FIG. 1). When these buttons are pushed, a ground is momentarily applied to the input of inverter 82 and NAND gate 84 respectively. This results in a low to high transition at the outputs of inverter 82 or NAND gate 84 which will set or reset test start flip/flop 72. The power up circuit consisting of R and C at 86 and NAND gate 84 assures that test start flip/flop will be in the set condition immediately after power to the testing system has been turned on.

Figure 3:
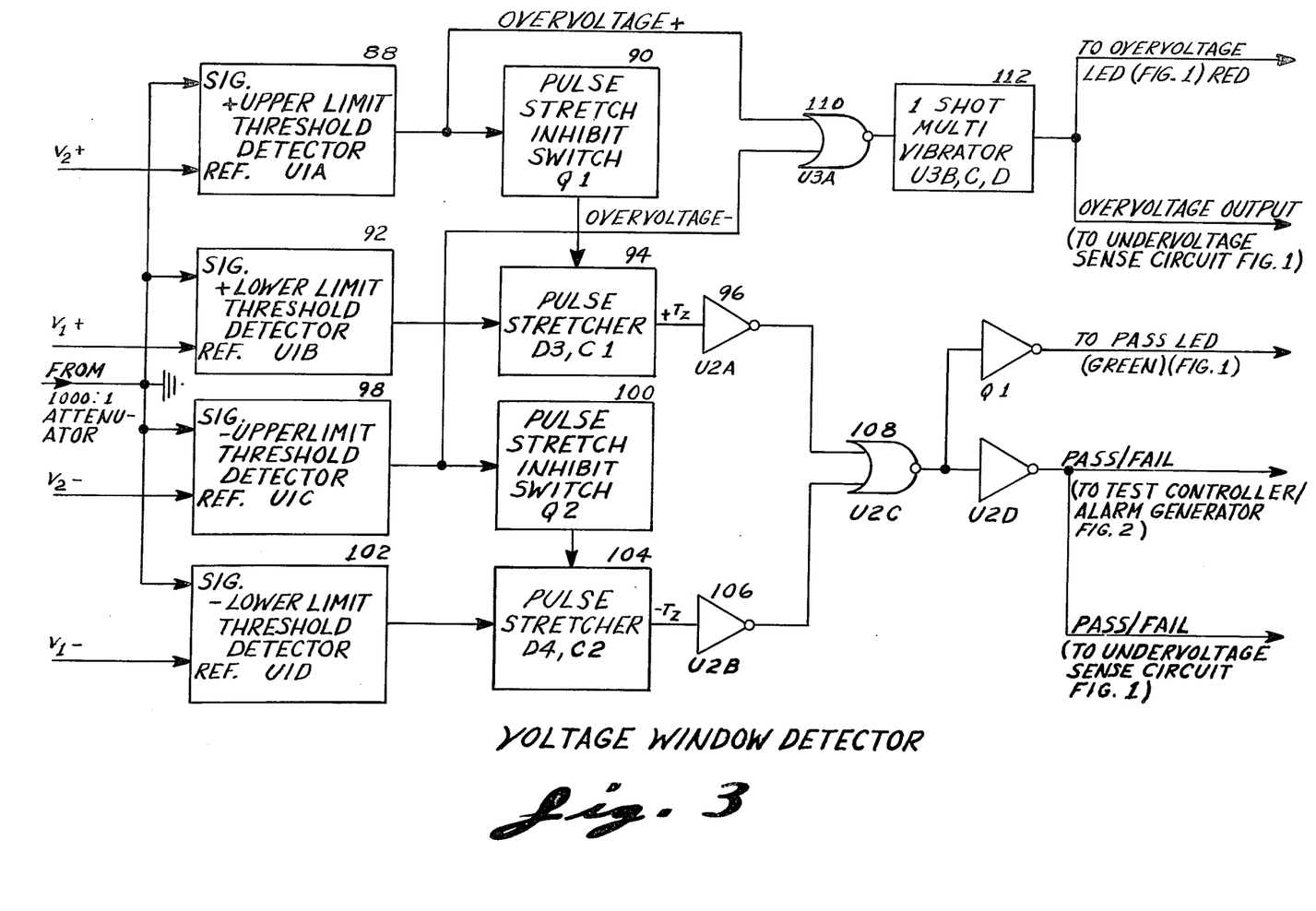
FIG. 3 is a schematic of the voltage window detector subassembly of the embodiment shown in FIG. 1.

FIG. 3 is an embodiment of the bipolar voltage window detector 26. The bipolar voltage window detector is organized into two channels, positive and negative, which process the pulse train. The outputs of these two channels are combined into a pass/fail output and an overvoltage output. The positive channel consists of upper limit threshold detector 88, pulse stretch inhibit switch 90, lower limit threshold detector 92, pulse stretcher 94 and inverter 96. The negative channel consists of upper limit threshold detector 98, pulse stretch inhibit switch 100, lower limit threshold detector 102, pulse stretcher 104 and inverter 106. The positive and negative channel outputs are combined by the two input NOR gate 108 to form the TZ pass/fail signal. After inversion by NOR gate 108 the signal becomes TZ pass/fail output. The outputs of the two upper limit threshold detectors 88, 98 are combined by the two input NOR gate 110 to form the overvoltage signal. The overvoltage signal is then inputted into a one shot multivibrator 112. If the input to the voltage window detector is derived from a tranzorb which clips the test signal within allowable tolerance, a pass condition, both lower limit thresholds will have been crossed but the upper limit thresholds will have not. The outputs of threshold detectors 92 and 102 will switch high (+12 V) for the period of time that the input is above the threshold (about 5 microseconds). The 5 microsecond wide pulses from the lower limit threshold detectors 92, 102 will be stretched by pulse stretchers 94, 104 respectively. The RC discharge time constant of the pulse stretchers is greater than the interpulse period of the input pulse train. Consequently, the charge on the pulse stretching capacitors will be maintained as long as the pass condition exists. The outputs of inverters 96, 106 will be in the low state, the output of NOR gate 108 will be high, and the pass/fail output will be low. If either or both of the lower limit thresholds is not crossed, this is a fault condition and the pass/fail line will be high. If the test set is driving an open circuit or if the device under test clips the test signal at a voltage above allowable tolerance, an overvoltage condition is sensed. To detect an overvoltage condition, one or both of the upper limit thresholds must be crossed. However, lower limit thresholds crossings will also occur. The pulse stretcher circuits would begin the charge up but would be prevented from doing so by the pulse stretcher inhibit switches 90, 100 which are activated by the upper limit threshold detectors. When an upper limit threshold is crossed, the threshold detector will generate a positive pulse whose duration is equal to the time that the input amplitude exceeds the threshold. These pulses will be coupled through the two input NOR gate 110 and will trigger the one shot multivibrator 112. The output of multivibrator 112 will go low and remain in this state as long as the overvoltage condition exists.

Figure 4:
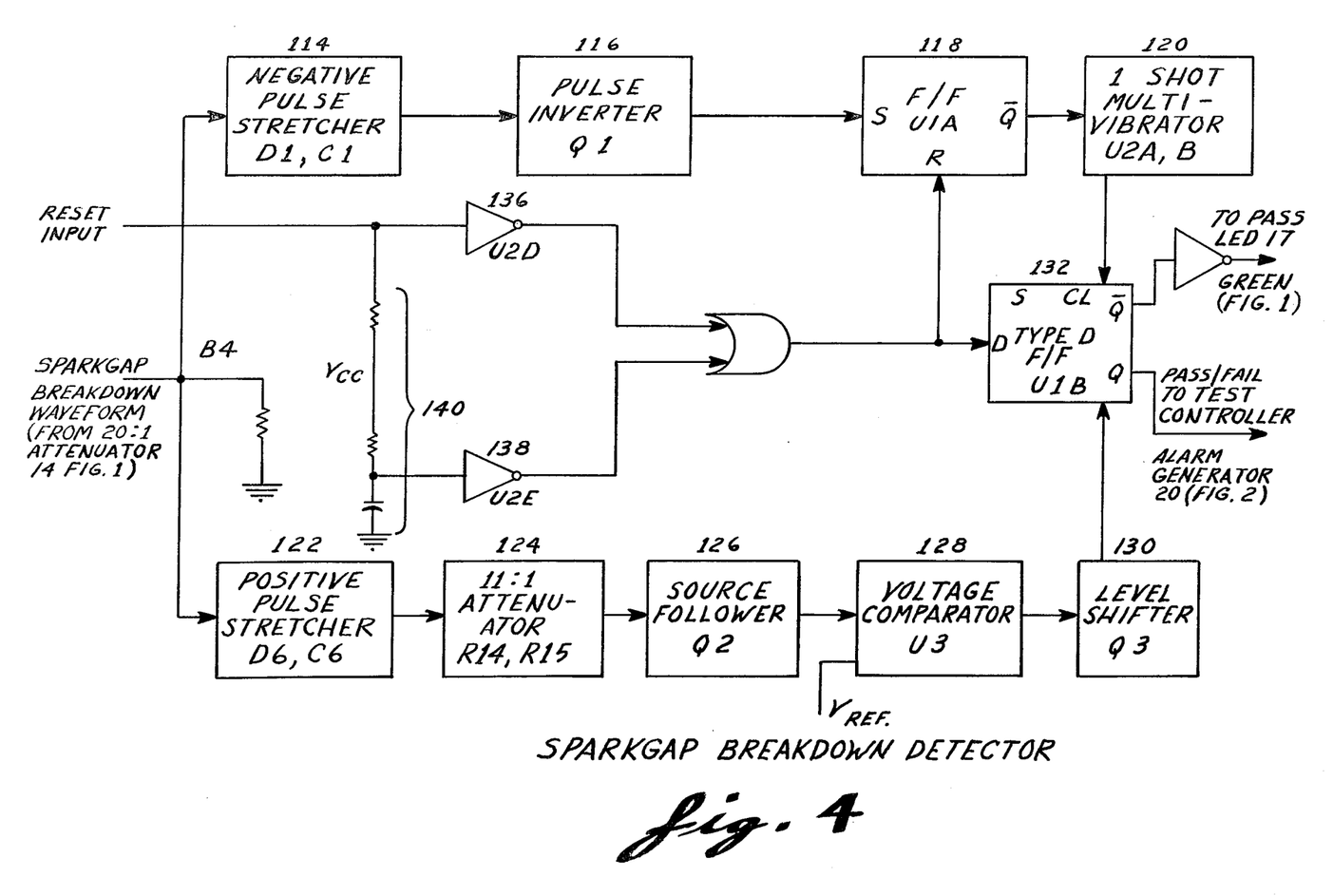
FIG. 4 is a schematic of the spark gap breakdown detector subassembly of the embodiment shown in FIG. 1.

FIG. 4 is an embodiment of the spark gap breakdown detector 16 (FIG. 1). The spark gap breakdown detector 16 receives an attenuated form of the voltage-time waveform from 20:1 attenuator 14 (FIG. 1) which is present at the input to the transient protection circuit as it is being stressed by a high voltage negative going single shot pulse. As described above, if the spark gap breaks down properly, there will be a positive going voltage excursion in late time. Thus, an input waveform would contain a negative going excursion in early time and a positive excursion of lower amplitude in late time. The spark gap breakdown detector is organized into a positive channel and a negative channel. The negative channel comprises negative pulse stretcher 114, pulse inverter 116, flip/flop 118 and one shot multivibrator 120. The positive channel comprises positive pulse stretcher 122, attenuator 124, source follower 126, voltage comparator 128 and level shifter 130. The negative channel terminates in the clock input of type D flip/flop 132 and the positive channel terminates in the D input of flip/flop 132. At the arrival of the clock pulse, the pass/fail decision is passed from the D input to the Q output of flip/flop 132. When a waveform, corresponding to a proper spark gap breakdown arrives at the input 134, the negative pulse stretcher becomes charged. The lengthened negative pulse drives the base of pulse inverter Q1, 116, driving it into saturation. A −12 to zero volt transition occurs at the collector of pulse inverter Q1, 116, which is AC coupled to the set input of flip/flop 118. The waveform at the set input will be a +12 volt, 0.5 microsecond pulse which sets flip/flop 118. The Q output of flip/flop 118 goes from high to low and this transition triggers one shot multivibrator 120. This causes the output of one shot 120 to make a high to low transition which remains in the low state until one shot 120 has timed out. When it times out, the output makes a high to low transition which causes the pass/fail decision at the D input of flip-flop 132 to be clocked to the Q output. The time duration of the one shot pulse is approximately 0.5 milliseconds. In the meantime, the positive late time excursion (if one is present) arrives at the input 134 and charges the storage capacitor of positive pulse stretcher 122 which discharges through the high resistance path of the attenuator 124. The resulting positive pulse which has a fast rise time and a long fall time is coupled by source follower 126 (e.g., a 3N128 MOSFET) to the input of the voltage comparator 128. The amplitude of the pulse is above the threshold of comparator 128 and the comparator 128 output goes high (+5 V). The +5 voltage level drives the base of level shifter/inverter transistor Q3, 130 and the collector of Q3 drops to zero volts and appears as a logic zero at the D input to flip/flop 132. When the one shot 120 has timed out the zero at the D input of flip/flop 132 is transferred to the Q output. The pass/fail output is taken from the Q output of flip/flop 132 and, for a pass condition will be in the low state. After about 2 milliseconds, positive pulse stretcher 122 will have discharged to a voltage level below the comparator 128 threshold. The flip/flop 132 will remain in this state until it is reset. The $\overline{Q}$ output, being in the high state for a pass condition, will drive the base of the LED 17 driven transistor and cause it to be illuminated indicating a pass condition. Flip/flops 118, 132 are reset when a ground is momentarily applied to the input of inverter 136 which occurs when the reset button 32 (FIG. 1) has been pushed. The power up circuit comprising inverter 138 and the resistive-capacitive circuit indicated at 140 assures that, immediately after test set power is applied, flip/flop 118 is in the reset state and flip/flop 132 is in the set condition.

FIG. 5 is an embodiment of bipolar pulse amplifier 22 (FIG. 1) and shows typical input and output waveforms at 21, 23, 25. The bipolar pulse amplifier is comprised of a positive channel and a negative channel. The positive pulse channel comprises NPN transistor 142 and PNP transistor 144 which amplify positive pulse train 21. The negative pulse channel comprises NPN transistor 146 which amplifies negative pulse train 23. The outputs of the two channels are combined into a common output by signal combiner 148. The positive channel amplifies pulses in the input train from +12 volts to +200 volts. The negative channel amplifies pulses in the input train from +12 volts to −200 volts. Signal combiner 148 allows the two signals to be combined while preserving isolation between the two channels. The output pulses 25 are typically 5 microseconds wide and have an open circuit amplitude of ±200 volts. The resistors in the signal combiner are in series with the device under test. The waveform across the device under test is, in effect, at the junction of the two R's in the signal combiner and the input of the 1000:1 attenuator 40 (FIG. 1) which drops the signal of interest to a level compatible with the input of the voltage window detector 26 (FIG. 1).

FIG. 6 is an embodiment of the reed relay pulser 10 (FIG. 1). The operation of the reed pulser is as follows: storage capacitor 54 is charged to 2.3 KV through charging resistor 55. Upon command from an external relay driver, dry reed relay 56 becomes momentarily energized. The contacts of relay 56 short to ground and capacitor 54 discharges rapidly through resistor 58. The resulting output waveform will be a negative 2.3 KV pulse with a 25 nanosecond rise time and an exponential decay time of approximately 0.5 microsecond. The waveform is attenuated 20:1 by the resistors 57, 59 circuit and from there it is input to the spark gap breakdown detector 16 (FIG. 1). The entire assembly is enclosed within an aluminum RFI shield box. The charging resistor 55, secured mechanically and isolated electrically by insulated bushing 53, serves as a feedthrough element for the high voltage supply.

The block diagram of undervoltage sense circuit 28 is shown in FIG. 1 and the operation is as follows: When an undervoltage condition is sensed by bipolar voltage window detector 26, both the pass/fail and the overvoltage outputs are high. These two signals enable AND gate 42 which enables astable multivibrator 44. The output of the astable multivibrator 44 is coupled to the modulation input of test controller alarm generator 20 where it modulates the frequency of the alarm oscillator.

While the invention has been described with reference to the accompanying drawings, it is to be clearly understood that the invention is not to be limited to the particular details shown therein as obvious modifications may be made by those skilled in the art. The embodiments of the invention should only be construed within the scope of the following claims.

What I claim is:

1. Apparatus for testing a transient protection circuit including a positive and negative high voltage protection device and a high voltage fast rise time protection device, said apparatus including first testing means for testing said positive and negative high voltage protection device, second testing means for testing said high voltage fast rise time protection device, and selection means for selecting one test mode of a first test mode for testing said positive and negative high voltage protection device and a second test mode for testing said high voltage fast rise time protection device, wherein:
    said first testing means comprises first test signal generating means for producing a bipolar first test signal of alternate spaced-apart positive and negative high voltage pulses;
    said second testing means comprises second test signal generating means for producing a second test signal of high voltage fast rise time test pulses with a voltage-time waveform;
    said selection means comprises switching means for connecting said transient protection circuit to receive a selected one of said first and second test signals;
    said first testing means further comprises
        comparison means for determining whether said alternate positive and negative high voltage pulses of said bipolar first test signal are within respective allowable positive and negative voltage windows, and
        first indication means for indicating pass or failure of said positive and negative high voltage device; and
    said second testing means further comprises
        means for sensing changes in said voltage-time waveform,
        means for comparing said changes to predetermined voltage-time levels, and
        second indicating means for indicating pass or failure of said high voltage fast rise time protection device.

2. Apparatus, as recited in claim 1, wherein said first test signal generating means for producing a bipolar first test signal of alternate positive and negative high voltage pulses comprises:
    means for generating a first pulse train of low voltage square waves with a specified period, said first pulse train square waves being generated at even increments of said period;
    means for generating a second pulse train of low voltage square waves with said specified period, said second pulse train square waves being generated at odd increments of said period;
    means for amplifying said first pulse train;
    means for amplifying and inverting said second pulse train; and
    means for combining said first pulse train with second pulse train.

3. Apparatus, as recited in claim 2, wherein said comparison means for determining whether said alternate positive and negative high voltage pulses of said bipolar first test signal are within respective allowable positive and negative voltage windows comprises:
    first comparator means for comparing said positive high voltage pulse with a reference voltage;
    second comparator means for comparing said negative high voltage pulse with a reference voltage; and
    means for generating a signal to activate said first indicating means.

4. Apparatus, as recited in claim 3, wherein said second test signal generating means for producing high voltage fast rise time test pulses comprises:
    means for generating a command signal; and
    means, responsive to said command signal, for generating a high voltage negative pulse with a rapid rise time and decay time.

5. Apparatus, as recited in claim 4, wherein said means for generating a high voltage negative pulse with a rapid rise time and decay time comprises:
    storage capacitor;
    means for charging said storage capacitor to a high voltage;
    a dry reed relay, responsive to said command signal, to discharge said storage capacitor to said switching means.

6. Apparatus, as recited in claim 5, wherein said means for sensing changes in said voltage-time waveform and means for comparing said changes to predetermined voltage-time levels comprises:
    means for sampling said high voltage negative pulse;
    voltage comparator means for comparing said high voltage rapid rise time waveform after said waveform has been applied to said transient protection circuit to a predetermined voltage level; and
    means responsive to said means for sampling said high voltage negative pulse for clocking a waveform duration.

7. Apparatus, as recited in claim 4, wherein:
    said rapid rise time is 25 nanoseconds; and
    said decay time is an exponential 5 microseconds.

8. Apparatus, as recited in claim 1, wherein said transient protection circuit comprises a low pressure, gas filled spark gap on an input side and a bipolar Zener device on an output side with a low value inductance inbetween.

9. Apparatus, as recited in claim 8, wherein the period of the first test signal is at least one order of magnitude greater than the width of the positive and negative high voltage pulses forming the first test signal.

10. Apparatus, as recited in claim 9, wherein the first test signal pulses have an open circuit amplitude of ±200 volts, the period of the first test signal is at least one millisecond, and the width of the first test signal pulses is approximately 5 microseconds.

11. Apparatus, as recited in claim 8, wherein said second test signal comprises a high voltage pulse with a rise time and an exponential decay time approximately one order of magnitude less than the width of the positive and negative pulses forming the first test signal.

12. Apparatus, as recited in claim 11, wherein said second test signal comprises a 2.3 KV pulse with a 25 nanosecond rise time and an exponential decay time of approximately 0.5 microsecond.

* * * * *